(12) United States Patent  (10) Patent No.: US 6,593,781 B2
Yoshimura  (45) Date of Patent: Jul. 15, 2003

(54) POWER SEMICONDUCTOR DEVICE

(75) Inventor: Kousuke Yoshimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/163,577

(22) Filed: Jun. 7, 2002

(65) Prior Publication Data

US 2003/0112040 A1 Jun. 19, 2003

(30) Foreign Application Priority Data

Dec. 13, 2001 (JP) ........................................ 2001-380074

(51) Int. Cl.[7] ................................................. H03K 3/00
(52) U.S. Cl. ........................................ 327/110; 327/108
(58) Field of Search ................................ 327/108, 110, 327/333

(56) References Cited

U.S. PATENT DOCUMENTS 6,522,178 B2 * 2/2003 Dubhashi et al. ........... 327/108

\* cited by examiner

*Primary Examiner*—Dinh T. Le
(74) *Attorney, Agent, or Firm*—Oblon, Spivak, McClelland, Maier & Neustadt, P.C.

(57) ABSTRACT

A power semiconductor device includes an input signal processor circuit to which control signals are input, and power device driving circuits for individually driving power devices based on output signal of the input signal processor circuit. Level shift circuits are individually inserted between the input signal processor circuit and the power device driving circuit on a p-side and between the input signal processor circuit and the power device driving circuit on an n-side to electrically insulate GND lines for the p-side and n-side power device driving circuits and a GND line for the input signal processor circuit.

9 Claims, 12 Drawing Sheets

ARROW: CURRENT PATH

POWER SEMICONDUCTOR DEVICE

BACKGROUND OF THE INVENTION

1. Field of the Invention

The present invention relates to a power converter formed of HVIC (high voltage integrated circuit), and particularly to a power semiconductor device having a function of simultaneously controlling both p-side and n-side driving power devices.

2. Related Art

FIG. 10 shows a circuit diagram of a motor driving inverter, which is classic as a power converter circuit, and basic operations thereof will be described hereinafter. Power devices (17, 18, 19, 20, 21, and 22) for respective U, V, and W phases are connected between a p-side (high voltage side) and an n-side (low voltage side) of an inverter-driving power source 23. FWDs (Free Wheel Diodes) 31, 32, 33, 34, 35, and 36 are connected parallel to the respective power devices. Input signal processor circuits (2, 3, and 4) are connected to a control signal generator circuit 1 such as a microcomputer that generates control signals for the respective power devices. A power source 30 feeds the input signal processor circuits.

Power-device driving circuits (11, 12, 13, 14, 15, and 16) and dedicated power sources (24, 25, 26, 27, 28, and 29) for driving the power devices are connected for the respective phases. Since a GND potential in the input signal processor circuit and the power device driving circuit are different from each other, photocouplers (5, 6, 7, 8, 9, and 10) is used to couple them.

In the practical inverter, the p-side power devices (17, 19, and 21) and the n-side power devices (18, 20, and 22) for the respective U, V, and W phases are controlled to perform switching according to a driving method. Thereby, motor control is implemented.

FIG. 11 shows an example of inverter circuit using HVICs in accordance with the circuit diagram shown in FIG. 10. The HVICs are individually formed to include input signal processor circuits (2 to 4), power device driving circuits (11 to 16), and level shift circuits (37, 38, and 39) each having a function equivalent to a photocoupler. In addition, the example as shown is configured to include one-chip integrated circuits (50, 51, and 52) for the respective U, V, and W phases.

The inverter formed of the HVIC has advantages that the reliability of the circuit can be enhanced by incorporating the level shift into the chip when compared to the inverter using the photocouplers, and that more inexpensive system can be provided by reducing the number of power sources and the number of components mounted on the inverter.

As shown in FIG. 11, the circuit using only the external power source 30 as a drive power source requires only the following additional components: bootstrap diodes (40, 41, and 42) and bootstrap capacitors (43, 44, and 45) provided as power sources that power the driving circuits (11, 13, and 15) for the p-side power devices (17, 19, and 21) for the respective phases.

FIG. 12 shows a schematic view of an inverter circuit using HVICs. The circuit is shown as an example in which control signals are transmitted from an inverter-driving control signal generator circuit to respective HVICs (50, 51, and 52) in U, V, and W phases to drive power devices (17, 18, 19, 20, 21, and 22). In this circuit configuration, GNDs of the respective HVICs (50 to 52) and emitter terminals of the respective power devices (18, 20, 22) are connected in each of the U, V, and W phases. L1 to L12 denote parasitic inductances as described later.

FIG. 13 shows an example of substrate with the circuit shown in FIG. 12 being mounted thereon. In an inverter circuit, standard values such as a voltage between P and N, a power device current rating and the like differ in accordance with the application. However, generally, the operation of the inverter circuit processing high voltages and high currents is implemented through high-speed switching performed using power devices. As such, it is strongly demanded that power loss in the inverter itself is reduced to become as small as possible. Ordinarily, the power loss is discharged to the outside of the inverter as joule heat.

In the configuration shown in FIG. 13, the emitter of the power device 18 in the U phase is connected to the GND of the HVIC and the anode of an FWD (32) via a bonding wire. It is further connected to an n-electrode (54) of a path bar (PB) through a bonding wire via the anode of the FWD (32). Losses in the inverter circuit can be categorized into two types, which are a DC loss and a switching loss.

The DC loss consists of a loss occurring with the power device and a loss occurring with a wire such as a bonding wire. The loss occurring with the power device is caused by current regularly flowing from the p-electrode to the n-electrode via the p-side power device, the load (inductance), and the n-side power device.

FIG. 14 shows a current path that causes the loss in the power device. Since the loss in the wire or the like is determined depending on the current and the electric resistance, the wire electric resistance needs to be reduced lower as the current increases higher.

The switching loss is the sum of a loss occurring with the power device when the power device turns from ON to OFF and turns from OFF to ON. Generally, the power device loss increases as the switching speed increases and as the voltage between P and N decreases. For this reason, the reduction in the loss plays an important role when the inverter circuit is used in a high-voltage and high-current region; hence, various improvements are continually made for the power device, particularly, in order to improve switching speed.

The path bar causes a part of loss occurring in the inverter. As such, the path bar needs to be shaped as thick and short as possible to reduce the electric resistance. However, the power device or other components, having a minimum size necessary to assure the rated current, need to be mounted on a package. In consideration of the above, generally, the shape as shown in FIG. 13 can be considered.

In the n-electrode (54), parasitic inductors exist, as shown with reference symbols L7 and L8. In addition, the parasitic inductors shown with reference symbols L1, L2, L3, L4, L5, and L6 exist in wire bonds between the power devices, the FWDs, and path bars (PB). Moreover, between a point A, a point B, and a point C of respective GND nodes of the U-phase, V-phase, W-phase driving HVICs (50, 51, and 52), there exist the parasitic inductances L9, L10, and L11 formed in wire bonds from GND terminals of the respective HVICs to emitter terminals of the HVICs and wiring patterns of a substrate (55). Furthermore, there exist the parasitic inductance L12 (between the U phase and the V phase) and a parasitic inductance L13 (between the V phase and the W phase) that are formed with wiring patterns connecting between the GND terminals of the respective HVICs.

When the inverter operation is performed in the circuit shown in FIG. 12, a malfunction can occur because of the parasitic inductances L1 to L13. Hereinafter, mechanism of the malfunction occurrence will be described with reference to FIGS. 14 and 15.

Referring to FIG. 14, the U-phase p-side power device (17) and the V-phase n-side power device (20) are in the ON state, and a current flows through a path shown by arrows. Then, as shown in FIG. 15, even after the U-phase p-side power device (17) has turned OFF from the ON state, the current is caused by energy stored in a load (60) of an inductance to keep flowing. Meanwhile, the U-phase n-side power device (18) is in the OFF state. In this case, however, since the FWD (32) connected parallel to the n-side power device (18) is in a forward-biased state with respect to the current, the current flows through the path in the following: load (60)→V-phase n-side power device (20)→n-electrode parasitic inductance (L7)→U-phase n-side FWD (32)→load (60). In addition, as can be seen by comparing FIG. 15 with FIG. 12, current is also flowing to the parasitic inductances L1, L2, L3, L4, L9, L10, and L12.

In the above case, a voltage V expressed in the following formula is generated in each of the inductances L:

$$V = L \times (di/dt) \text{ (where "} di/dt \text{"=current variation ratio)}$$

Accordingly, a potential difference is occurring between the point A of the GND node of the U-phase driving HVIC (50) and the point B of the GND node of the V-phase driving HVIC (51), which are shown in FIG. 12. Digital control signals are transmitted to the HVICs (50 to 52) in the respective phases from the control signal generator circuit (1) shown in FIG. 12. However, because of the variations in the GND potential as described above, a case can occur in which the HVICs (50 to 52) in the respective phases erroneously recognize the control signals, thereby causing a malfunction.

SUMMARY OF THE INVENTION

The present invention provides a power semiconductor device capable of operating without causing erroneous recognition of control signals that can occur because of variations in ground potential.

The power semiconductor device includes an input signal processor circuit to which control signals are input, and power device driving circuits for driving power devices. Level shift circuits are individually inserted between the input signal processor circuit and the power device driving circuit on a p-side and between the input signal processor circuit and the power device driving circuit on an n-side to electrically insulate ground lines for the p-side and n-side power device driving circuits and a ground line for the input signal processor circuit.

DESCRIPTION OF THE PREFERRED EMBODIMENTS

First Embodiment

Figure 1:
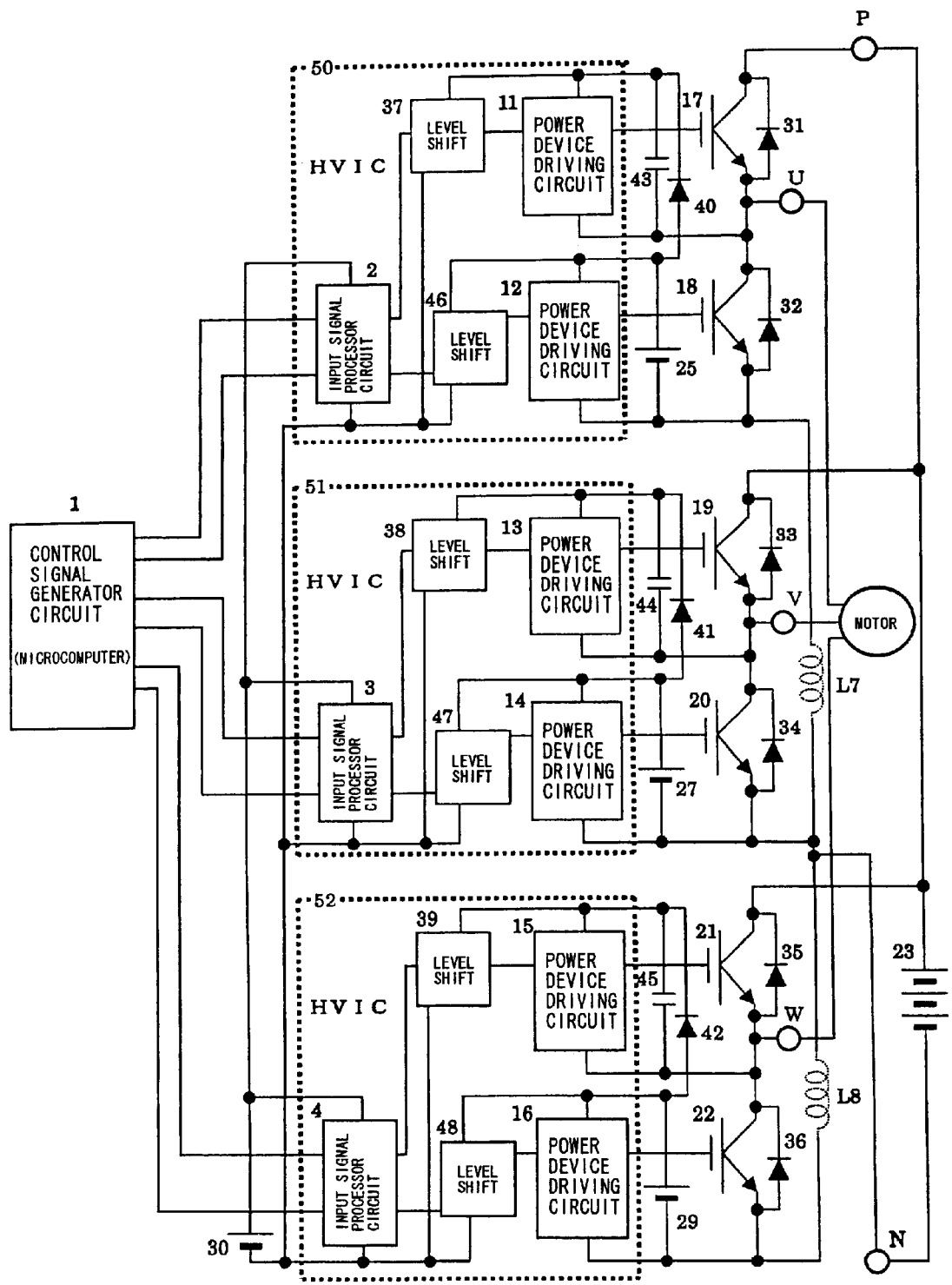
FIG. 1 is a circuit diagram of a first embodiment of a power semiconductor device according to the present invention.
Figure 10:
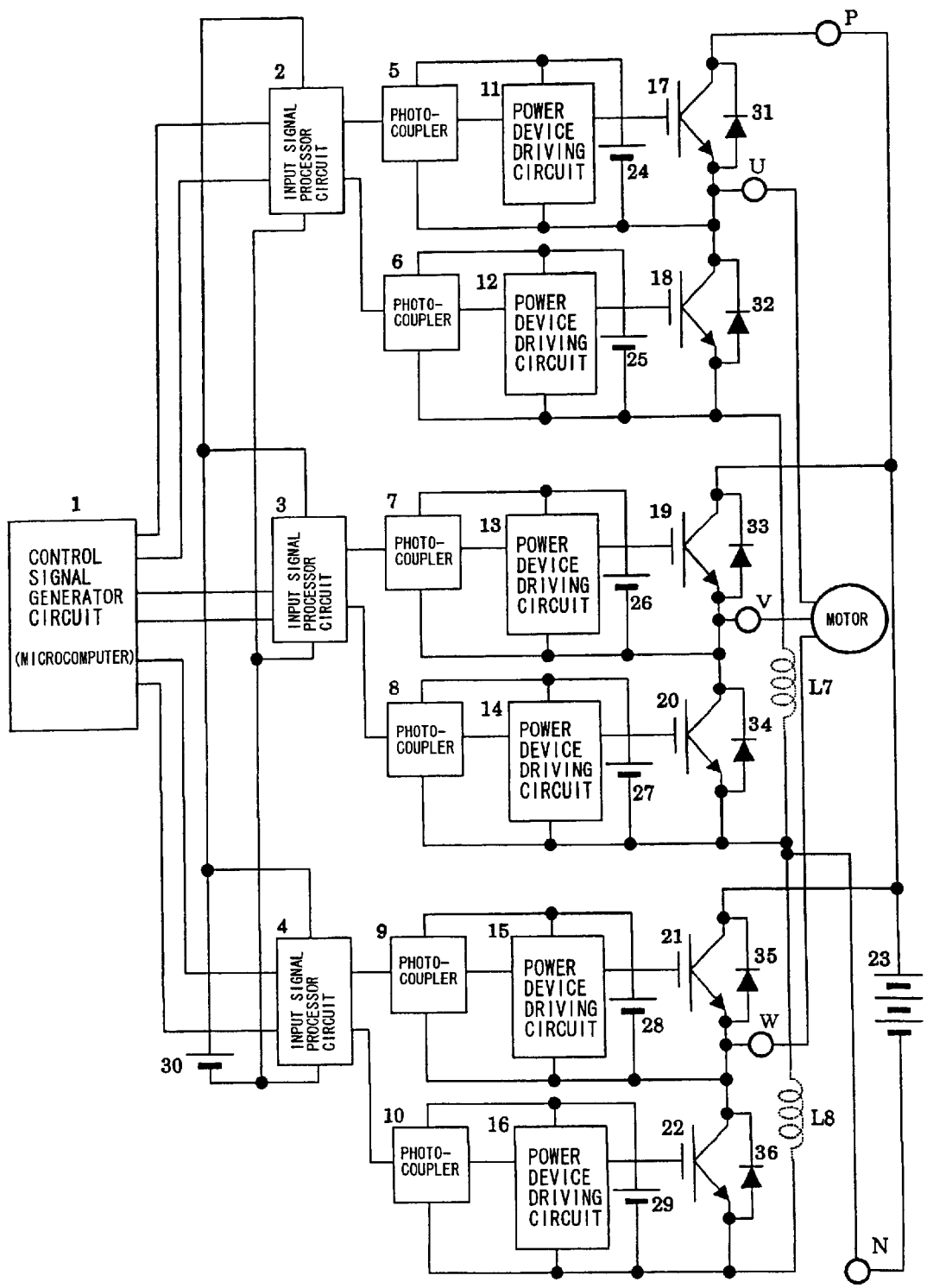
FIG. 10 is a circuit diagram showing power semiconductor using conventional discrete components.
Figure 11:
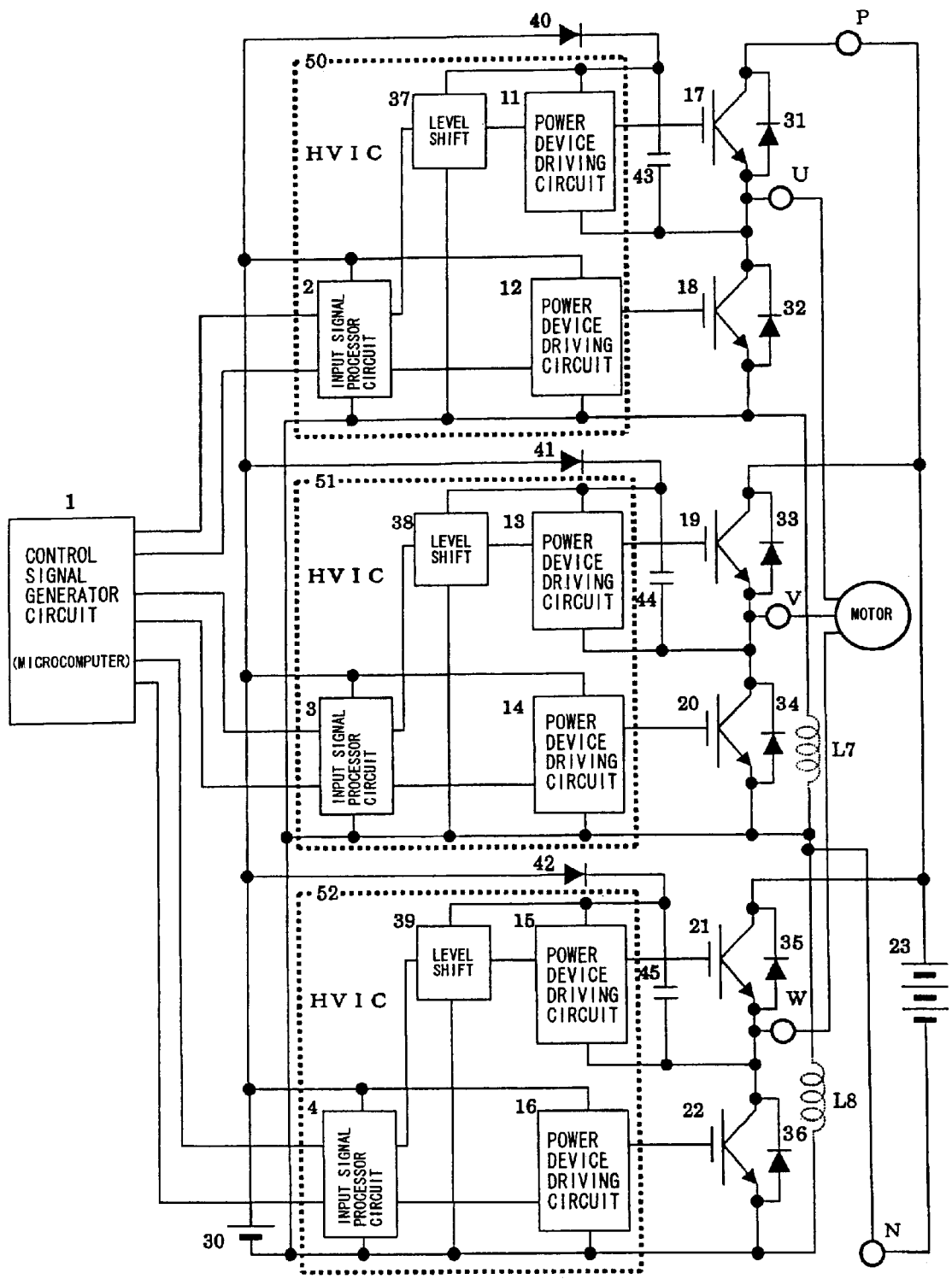
FIG. 11 is a circuit diagram of a circuit in which the power semiconductor shown in FIG. 10 are replaced with HVICs having a conventional half-bridge configuration.
Figure 12:
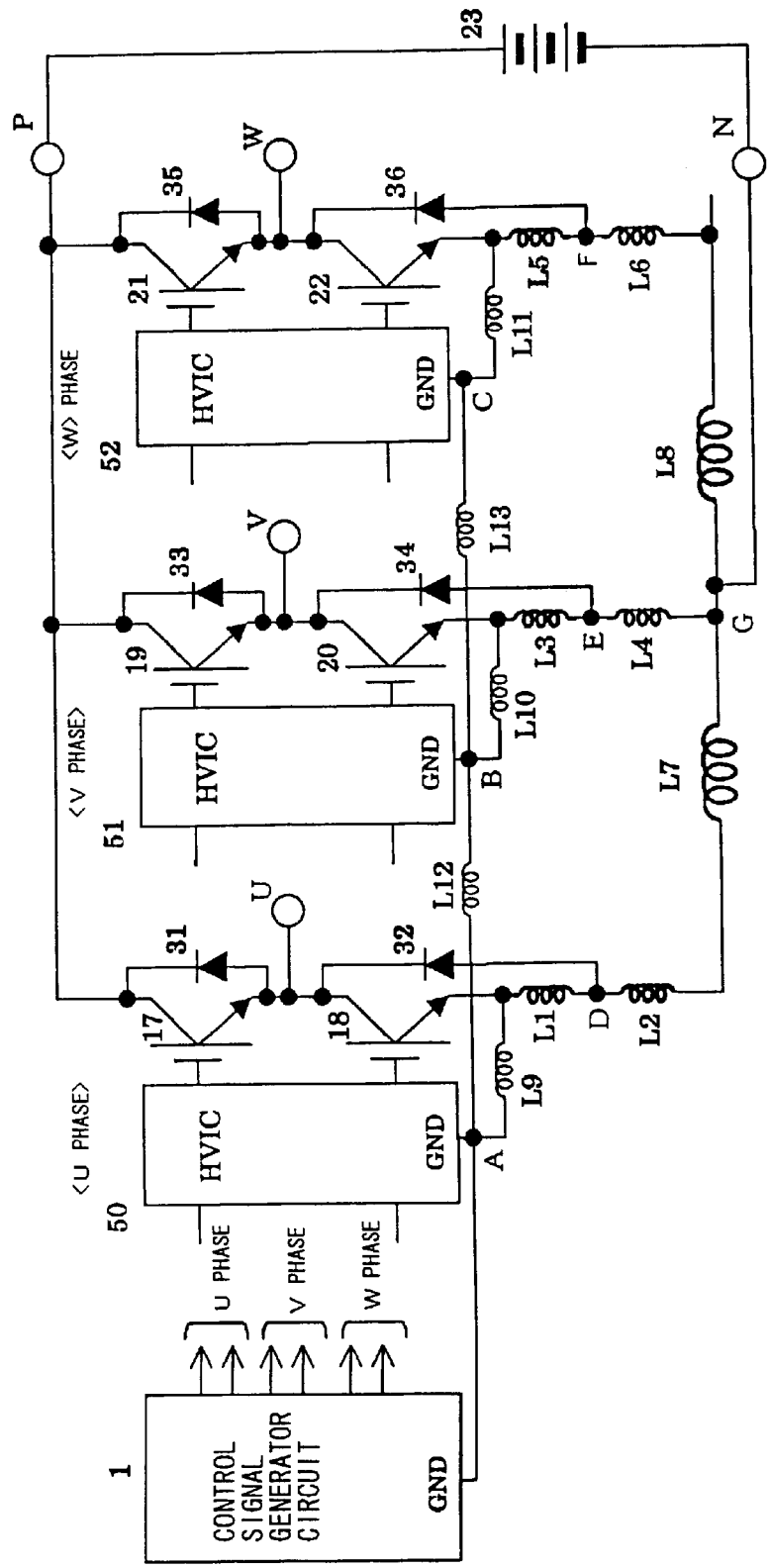
FIG. 12 is a circuit diagram showing parasitic inductances included in the circuit configuration shown in FIG. 11.
Figure 13:
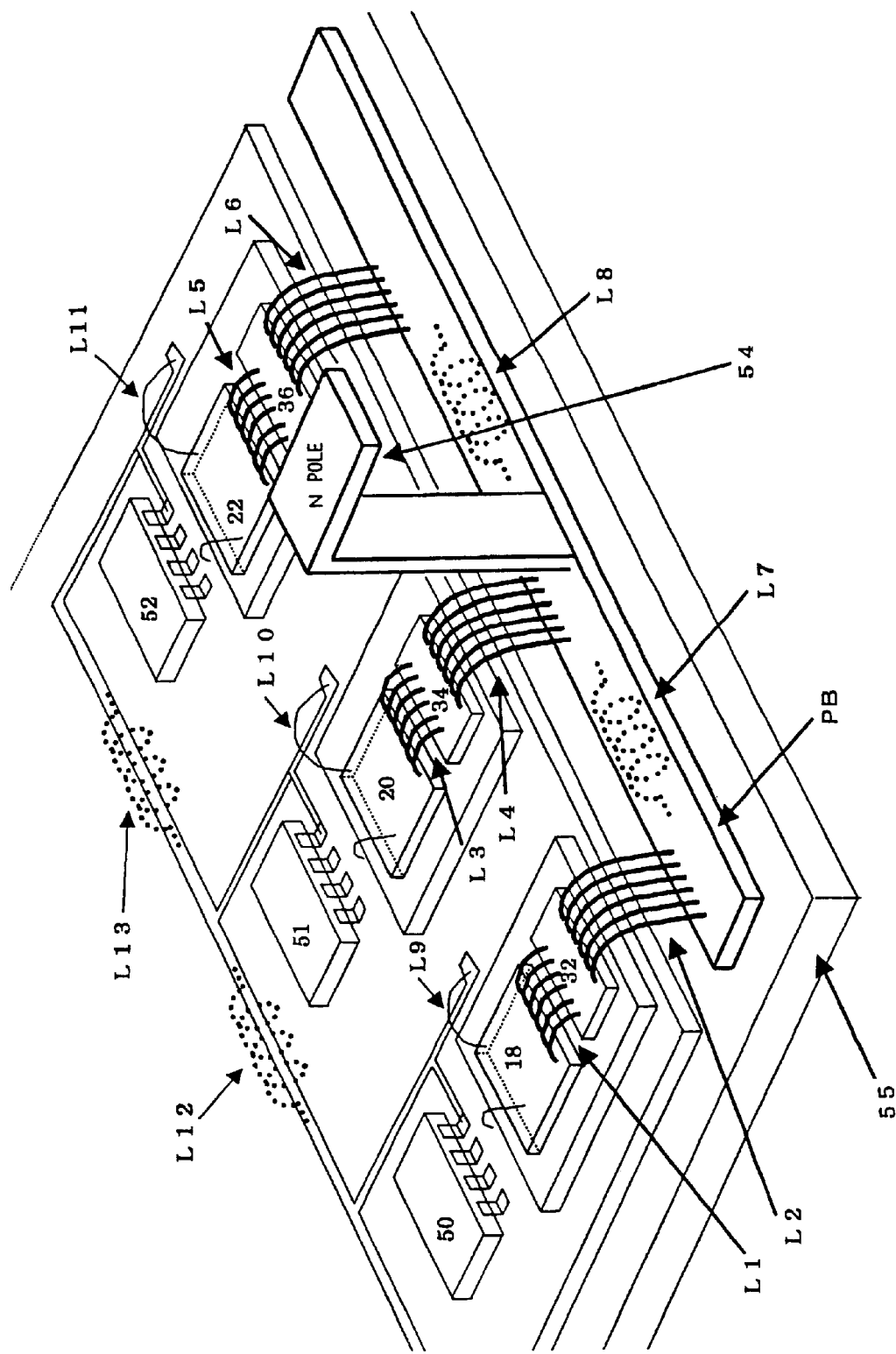
FIG. 13 is a component-mounted view showing a state where the power semiconductor devices are mounted on a substrate.
Figure 14:
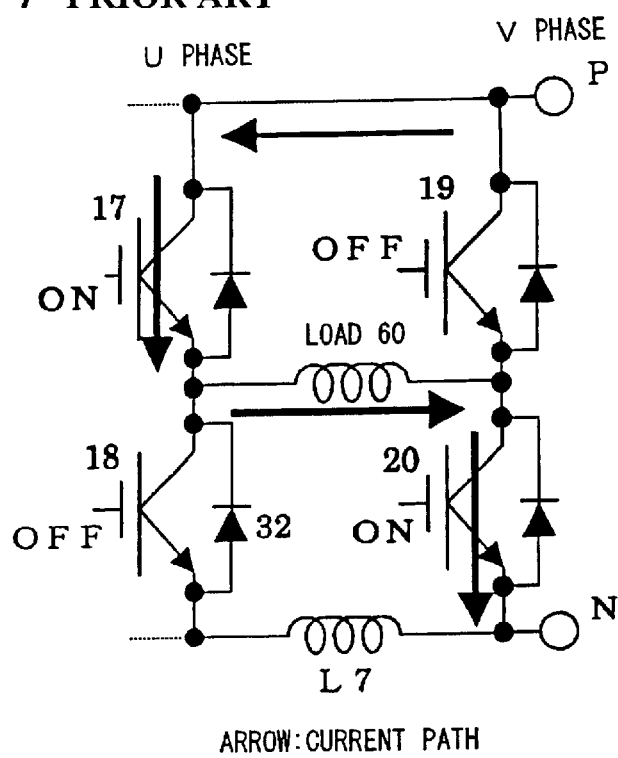
FIG. 14 shows a current path during operation of a power semiconductor device.
Figure 15:
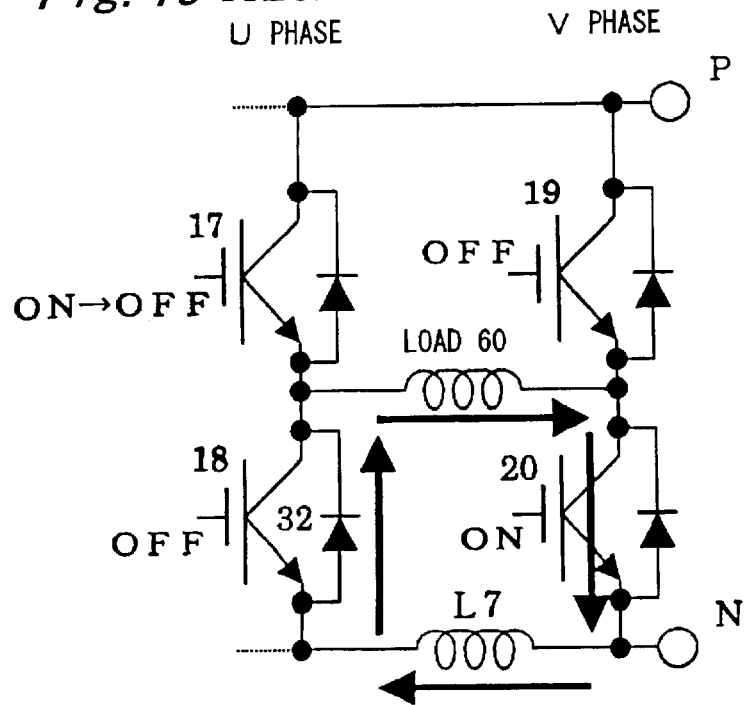
FIG. 15 shows a current path during operation of a power semiconductor device.

FIG. 1 shows a first embodiment of the present invention. The figure is a circuit diagram of a motor driving inverter that uses three HVICs (50, 51, and 52) to which the present invention is applied. When compared to a conventional example shown in FIG. 10, main changes are as follows: photocouplers (5 to 10) used for each U, V and W phase are replaced with level shift circuits (37, 38, 39, 46, 47, and 48); power device control circuits are formed of HVICs in each U, V and W phase; power sources of p-side driving circuits for the U, V and W phases are constituted by capacitors (43, 44 and 45) and diodes (40, 41 and 42) by means of the bootstrap circuit method, thereby constituting the circuit with the smaller numbers of power sources than the conventional one.

The above configuration therefore enables the number of components to be reduced smaller than that in the configuration using the transformer-using method, thereby enabling a cost reduction to be expected. Moreover, since the p-side and n-side driving circuits are integrated on the same semiconductor, the difference in propagation-delay times of the p-side driving circuit and the n-side driving circuit can be reduced, and the dead time in the inverter can be reduced smaller than that in the conventional circuit.

Figure 7:
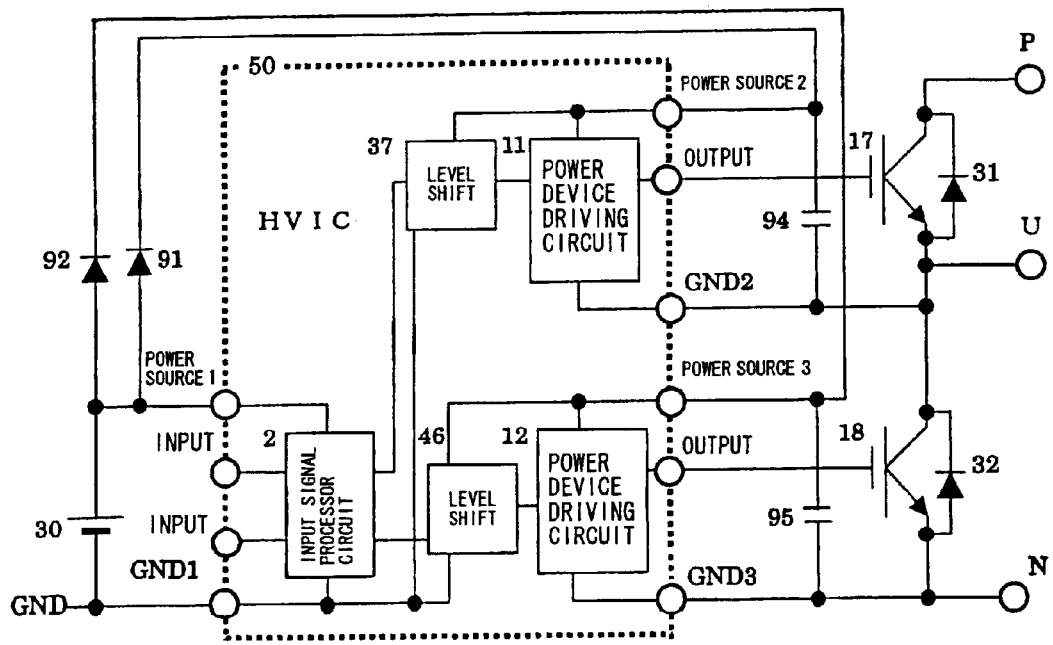
FIG. 7 is a circuit diagram of a circuit using bootstrap power sources for individually feeding p-side and n-side power device driving circuits.
Figure 8:
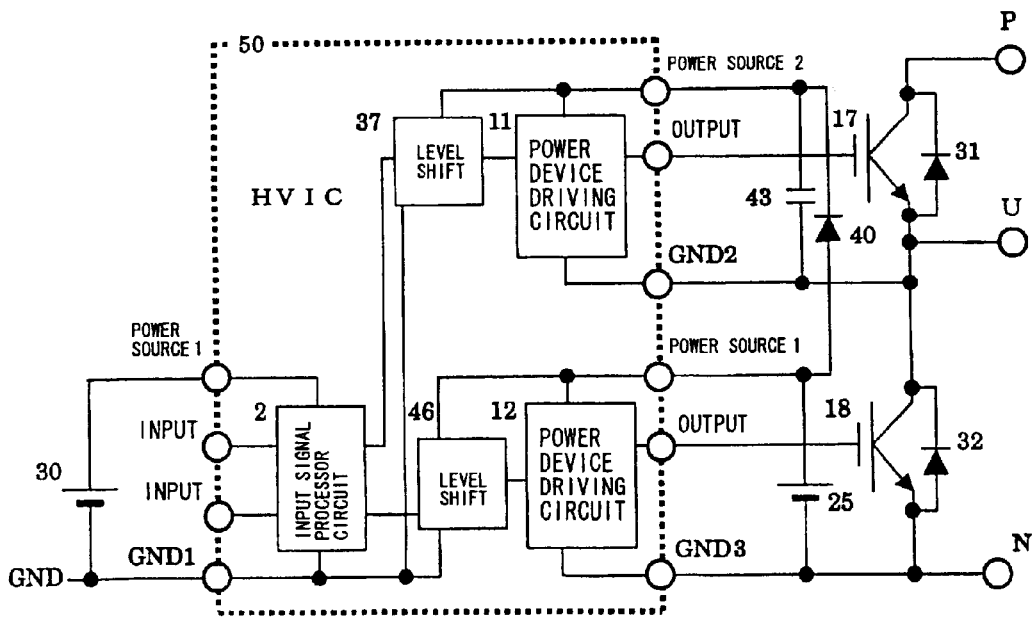
FIG. 8 is a circuit diagram of a circuit using a bootstrap power source for feeding only a p-side power device driving circuits.
Figure 9:
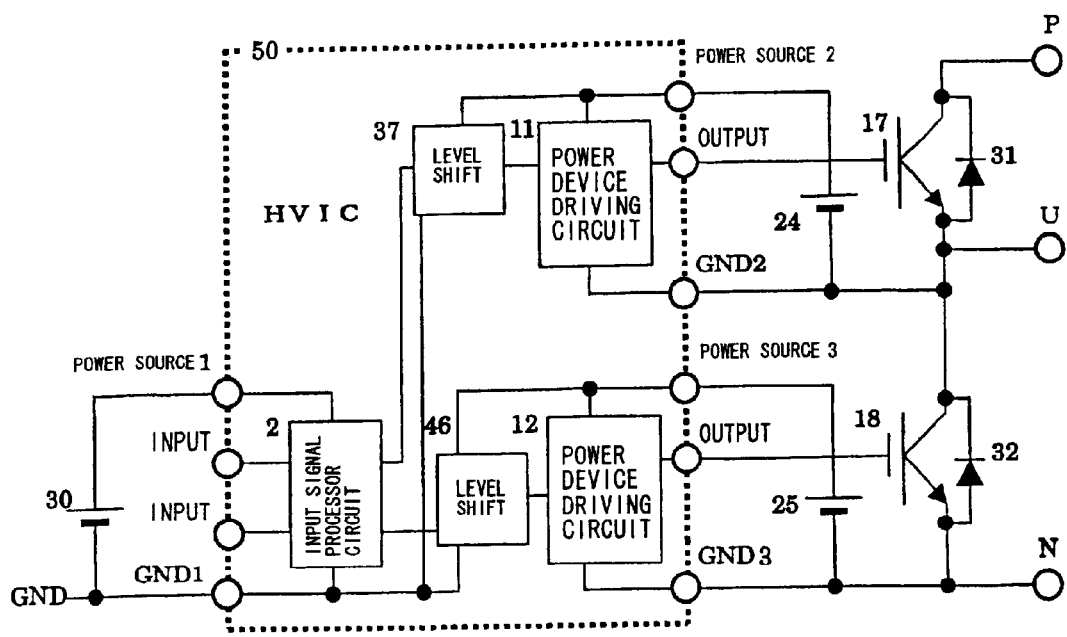
FIG. 9 is a circuit diagram of a circuit using discrete power sources for individually feeding p-side and n-side power device driving circuits.

IC external power source configurations employing the above method are shown in FIGS. 7, 8, and 9. While these figures show the configurations in only the U phase, the configurations in the other phases are the same thereas.

Referring to FIG. 7, via a bootstrap circuit formed of a diode (91) and a capacitor (94), a power source 30 for an input signal processor circuit (2) feeds a p-side power device driving circuit (11). Similarly, an n-side power device driving circuit (12) is fed via a bootstrap circuit formed of a diode (92) and a capacitor (95). Thus, since the fewer power sources are used, the number of components is reduced.

However, because of the fewer power sources, the configuration has restrictions regarding activating functions, control methods, and the like.

In a configuration shown in FIG. 8, an n-side driving power source (25) is provided only in an n-side power device driving circuit (12). A p-side power device driving circuit (11) is thereby fed via a bootstrap circuit formed of a diode (40) and a capacitor (43). In this configuration, while the component-reducible effect is inferior to that in the circuit shown in FIG. 7, the restrictions regarding activating functions, control methods, and the like are reduced. The configuration in FIG. 1 employs the above-described feeding method.

A configuration shown in FIG. 9 uses power sources (24 and 25) that are provided independently of each other for feeding the respective p-side and n-side power device driving circuits (11 and 12). While the configuration has the largest number of components among those in the above-described configurations, the configuration is featured that it has no restrictions regarding activating functions, control methods, and the like, so that it has a high usability.

Hereinafter, operation of the circuit shown in the diagram of FIG. 1 will be described. Control signals for controlling the motor driving inverter are generated in the control signal generator circuit (1). The control signals are then input to the HVICs (50, 51, and 52). In these HVICs, a common power source 30 is connected to input signal processor circuits (2, 3, and 4). Power sources (25, 27, and 29) are discretely connected to n-side power device driving circuits (12, 14, and 16), respectively.

Meanwhile, power is supplied to the p-side power device driving circuit (11) in the HIVC for the U-phase (50) from the power source (25) for the n-side power device driving circuit (12) via a bootstrap circuit formed of a diode (40) and a capacitor (43). In the same manner, power is supplied in each of the other HVICs, i.e. the HVICs (51 and 52) in the V and W phases.

The respective U, V, and W phases have the same circuit configurations and operate in the same manner. As such, hereinafter, the operation of the U phase will be described in detail as a representative example. Signals input to the HVIC (50) are processed in the input signal processor circuit (2), and are then separately input to level shift circuits (37 and 46).

The signal input to the n-side level shift circuit (46) is a signal having a voltage amplitude with the negative polarity side (GND) of the power source (30) being set as a reference potential. The signal is level-shifted to a signal having a voltage amplitude with the negative polarity side of the power source (25) being set as a reference potential. Then, the p-side level shift circuit (37) level-shifts the input signal to a signal having a voltage amplitude with the negative polarity side of the capacitor (43) being set as a reference potential.

In the circuit diagram shown in FIG. 1, parasitic inductances existing in the package are shown with reference numerals L7 and L8 in the path from an N-terminal to the U-phase and W-phase power devices. When the power semiconductor device performs switching operation, a motor load current flows to the above-mentioned parasitic inductances, and voltages occur according to the ratio di/dt at the time of load-current switching. Thereby, potential differences occur in portions including, for example, portions on the respective negative polarity sides of the power sources (25, 27, and 29) connected to the n-sides in the U, V, and W phases; portions on the emitter-terminal sides of the power devices (32, 34, and 36); and the nodes on the GND sides of the n-side power device driving circuits (12, 14, and 16) of the HVICs (50, 51, and 52).

However, since the level shift circuit (46) functions to electrically insulate the GND of the n-side power device driving circuit (12) (that is, the n-side potential in each of the respective phases) from the GND of the input signal processor circuit (2), the GND node of the HVIC (50) connected to the negative electrode of the power source (30) for the input signal processor circuit (2) is not influenced by variations in the n-side potential that can occur during operation of the power device. Consequently, no malfunction occurs therein. The same is true of each of the other HVICs.

Second Embodiment

Figure 2:
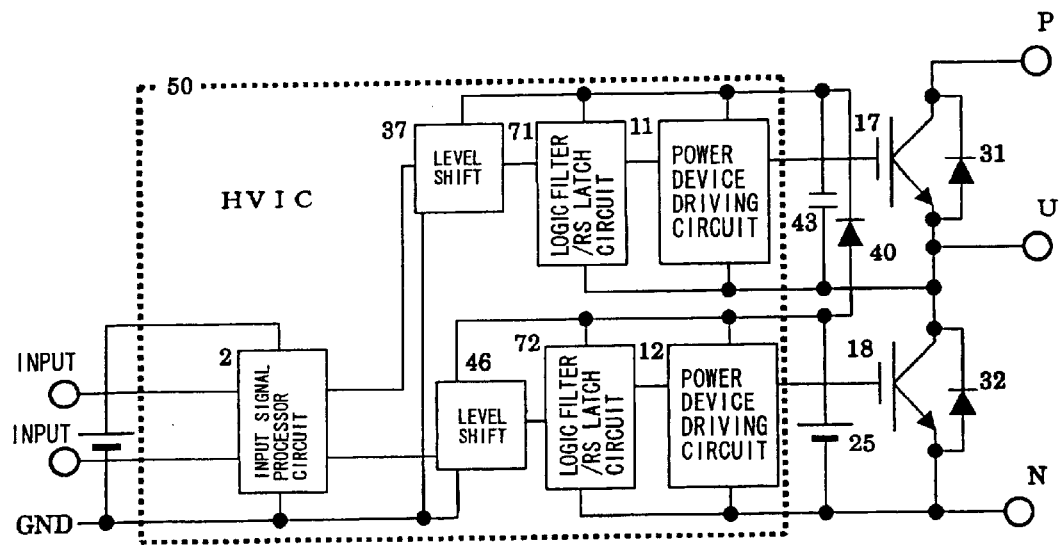
FIG. 2 is a circuit diagram of a second embodiment of a power semiconductor device according to the present invention.

FIG. 2 shows a second embodiment of the present invention. Hereinafter, as in FIG. 1, since U, V, and W phases have the same functions as in FIG. 1, only the U phase will be described hereinafter. In the configuration shown FIG. 2, logic filter/RS latch circuits (71 and 72) are inserted to rear stages of the level shift circuits (37 and 46), respectively.

Because of the power device operation, terminal voltages of the power source (25) and the capacitor (43) vary; and when the voltages abruptly vary, malfunction of the level shift circuits (46 and 37) occurs. However, each logic filter/RS latch circuits (71 and 72) removes an erroneous signal that have been output from the level shift circuit, thereby preventing malfunction of the power device.

Third Embodiment

Figure 3:
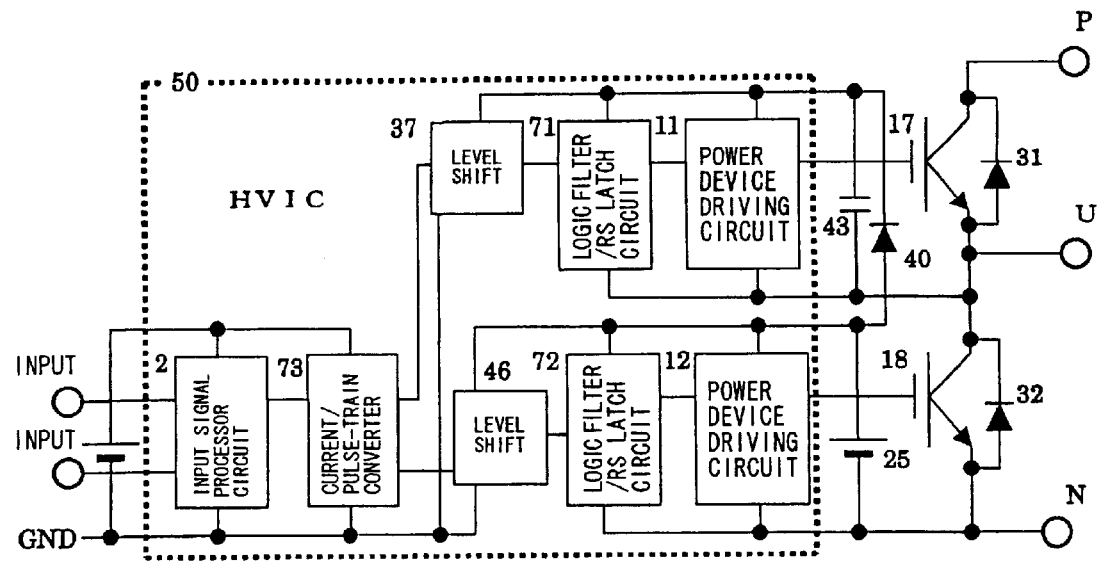
FIG. 3 is a circuit diagram of a third embodiment of a power semiconductor device according to the present invention.

FIG. 3 shows a third embodiment of the present invention. In the configuration shown FIG. 3, a current-pulse-train converter circuit (73) is inserted to a front stage of level shift circuits. When the level shift circuits (37 and 46) process the voltage-amplified signals received from the input signal processor circuit (2), current consumption during operation of the level shift circuits increases. For this reason, the voltage-amplified signal is converted in the current-pulse-train converter circuit (73) into a pulse signal, and the pulse signal is level-shifted by the level shift circuit. The above-described circuit configuration enables the current consumption in the level shift circuits to be reduced.

Fourth Embodiment

Figure 4:
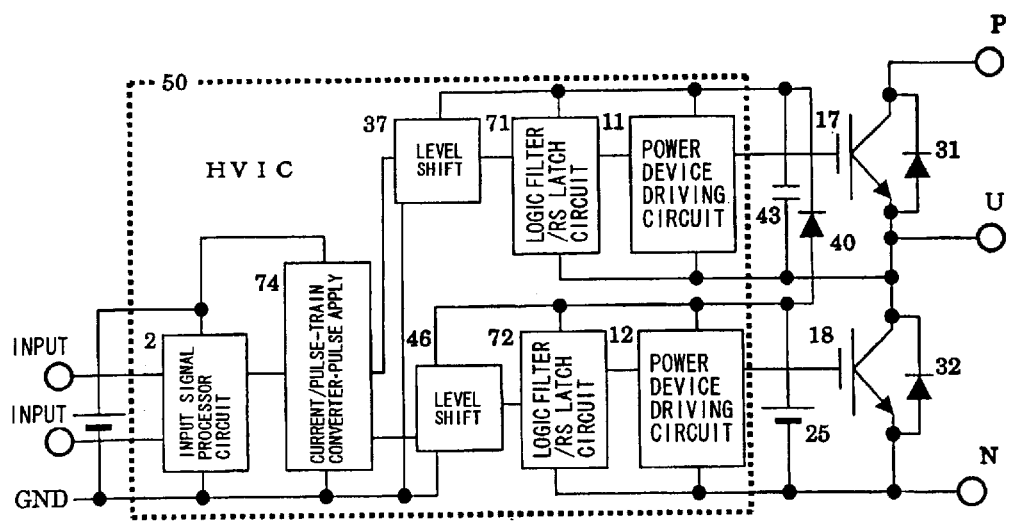
FIG. 4 is a circuit diagram of a fourth embodiment of a power semiconductor device according to the present invention.

FIG. 4 shows a fourth embodiment of the present invention. In the configuration shown FIG. 4, a current-pulse-train converting/pulse-applying circuit (74) is used instead of the current-pulse-train converter circuit (73) shown in FIG. 3. While the level shift circuits (37 and 46) for communicating the ON state or OFF state are maintained in the ON or OFF state, the current-pulse-train converting/pulse-applying circuit (74) periodically inputs pulse signals to the level shift circuits (37 and 46). Thereby, even when the terminal voltages of the power source (25) and the capacitor (43) vary, malfunctions that can occur in the level shift circuits (46 and 37) can be prevented.

Fifth Embodiment

Figure 5:
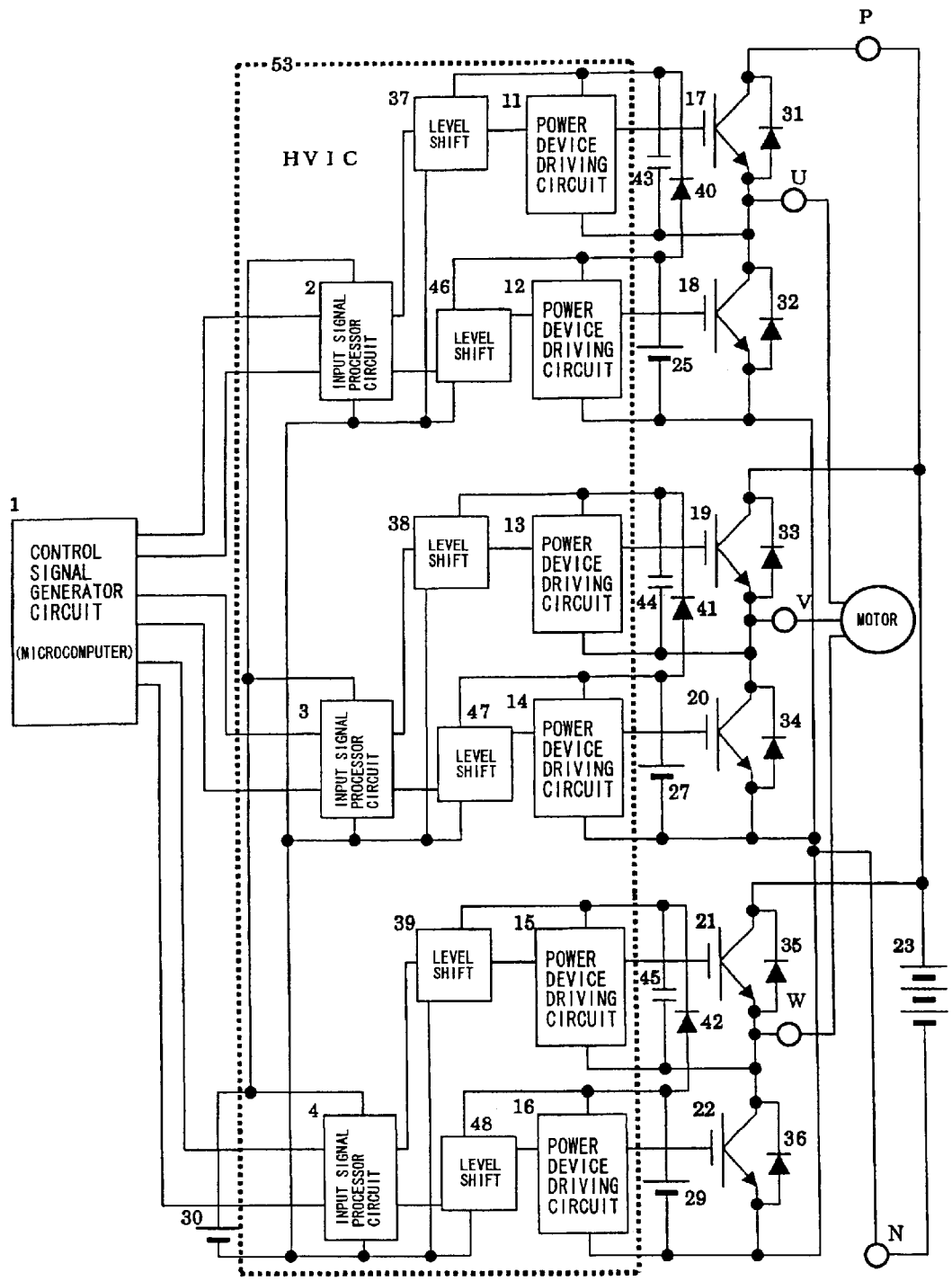
FIG. 5 is a circuit diagram of a fifth embodiment of a power semiconductor device according to the present invention.

FIG. 5 shows a fifth embodiment of the present invention. In the configuration shown in FIG. 5, the three HVICs (50, 51, and 52) each having a half-bridge configuration, which are used in the configuration shown in FIG. 1, are integrated into one HVIC (53).

Sixth Embodiment

Figure 6:
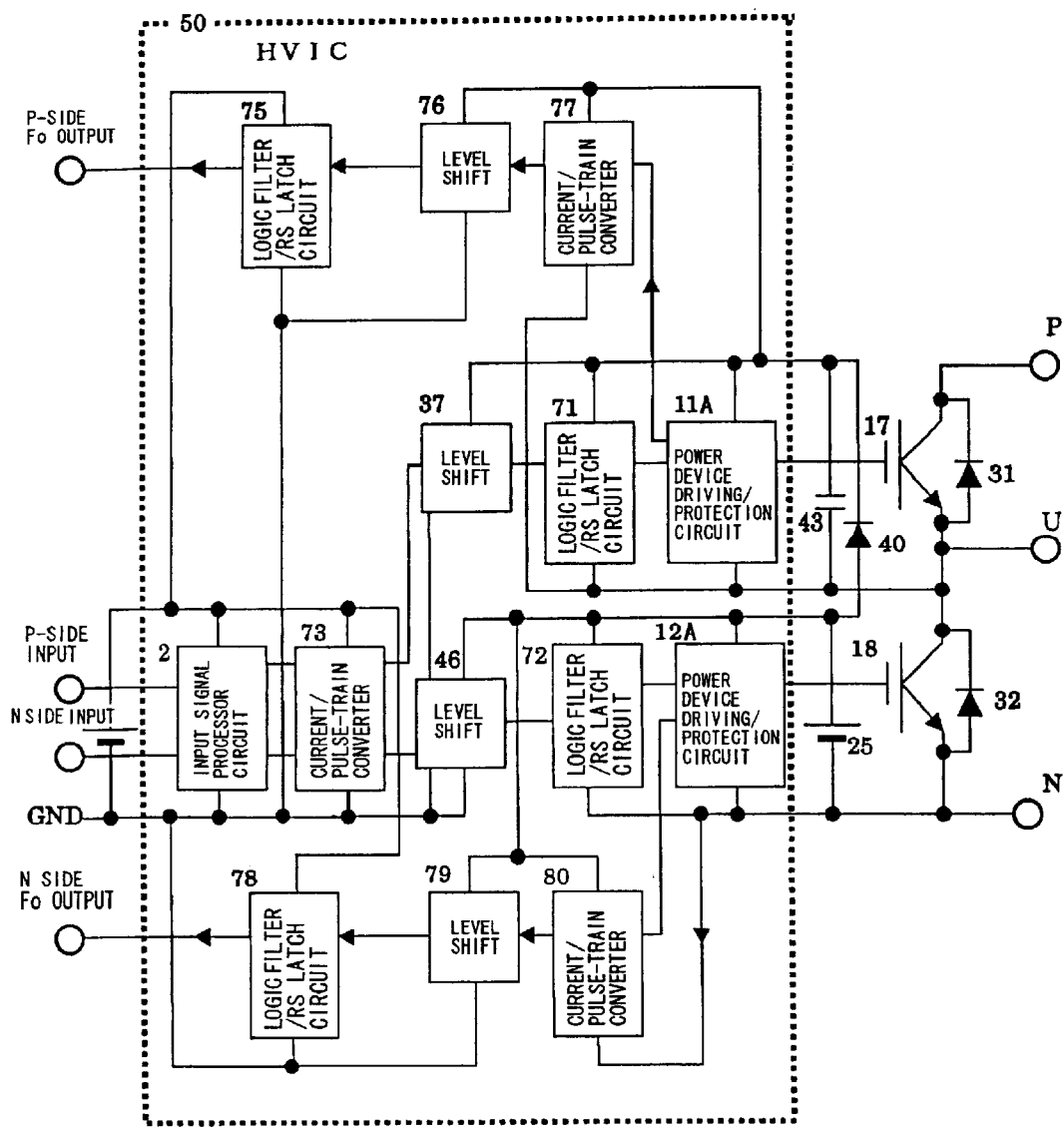
FIG. 6 is a circuit diagram of a sixth embodiment of a power semiconductor device according to the present invention.

FIG. 6 shows a sixth embodiment of the present invention. In the configuration shown FIG. 6, p-side and n-side Fo(fault)-signal output terminals are added. The Fo-signal output terminals communicate abnormal signals that have been output from power device driving/protection circuits (11A and 12A) in the HVICs to upper-stage control circuits. The power device driving/protection circuit is formed to include a protection circuit added to output an abnormal signal as a result of detection of, for example, a shortcircuit, an overload, an overvoltage, and an overtemperature in the power device.

In respective signal-transmitting paths used to output the Fo signals, there are provided level shift circuits (76 and 79) for level shift the abnormal signal to a desired level, and current-pulse-train converter circuits (77 and 80). Each of current-pulse-train converter circuits have the same function as that of the current-pulse-train converter circuit (73) used in the configuration shown in FIG. 3.

Also in this case, malfunction can occur because of variations in potentials in the n-side power source (25) and the p-side capacitor (43). To prevent the malfunction, logic filter/RS latch circuits (75 and 78) are provided in rear stages of the respective level shift circuits (76 and 79). Each of the logic filter/RS latch circuits have the same function as that of those used in the configuration shown in FIG. 2.

According to the invention of a first aspect, the level shift circuit is inserted between the input signal processor circuit and each of the p-side and n-side power device driving circuits. Thereby, even when noise or the like has overlapped in the GND line in the n-side (low side), since the GND line is insulated from the GND line for the input signal processor circuit, a malfunction in which a signal from the input signal processor circuit is erroneously recognized due to the noise or the like can be prevented.

In the invention of a second aspect, a power source line for the input signal processor circuit and power source lines for the p-side and n-side driving circuits may be electrically insulated. In this case, since the insulated power source circuit is not a bootstrap circuit, but it is formed of, for example, a transformer, bootstrap-circuit specific problems, such as restrictions in initial-charging and control methods, do not occur. In addition, since the power source circuit is of methods combined with a transformer method, a low-cost method can be selectively implemented while minimizing the level of the noise-causing malfunction.

In addition, the invention of a third aspect may have a configuration in which all power source lines are electrically insulated for the input signal processor circuit and the p-side and n-side driving circuits. In this case, since the insulated power source circuit is not a bootstrap circuit, but it is formed of a transformer or the like, bootstrap-circuit specific problems, such as restrictions in initial-charging and control methods, do not arise. Consequently, a stable operation can be expected.

Moreover, the invention of a fourth aspect may have a configuration including interlock circuits each having a function, wherein when an erroneous signal simultaneously turning on the p-side and n-side drive power devices is input from an external source to the input signal processor circuit, the function invalidates the erroneous signal. This configuration enables the prevention of shortcircuiting in the P/N-side power device.

Furthermore, the invention of a fifth aspect may have a configuration including logic filter/RS latch circuits each provided in a rear stage of the level shift circuit. This configuration enables the removal of an erroneous signal output from the level shift circuit because of variations in power source and GND potentials.

Furthermore, the invention of a sixth aspect may have a configuration including a current-pulse-train converter circuit connected to a rear stage of the input signal processor circuit to convert a voltage-amplified signal output from the input signal processor circuit into a current-pulse train. This configuration enables reduction in the current consumption in the level shift circuits.

Furthermore, the invention of a seventh aspect may have a configuration including pulse-applying functions each provided in the current-pulse-train converter circuit to periodically input pulse signals to the level shift circuit while the level shift circuit is maintained in an ON or OFF state. As such, even when the terminal voltage of the power source or the like is varied according to operation of each of the power device, erroneous recognition in the level shift circuit can be prevented, and a malfunction can therefore be prevented.

Furthermore, the invention of a eighth aspect may have a configuration including protection circuits each for detecting an abnormality such as a shortcircuit, an overload, or an overvoltage in the p-side or n-side drive power device, wherein detection signals from the circuits are output to external control circuits via second level shift circuits. In this configuration, an abnormality occurring in the power device can be securely detected.

Furthermore, the invention of a ninth aspect may have a configuration including current-pulse-train converter circuits each provided in a front stage of the second level shift circuit to convert a voltage-amplified signal output from the protection circuit into a current-pulse train. This configuration enables reduction in the current consumption in the second level shift circuit.

Still furthermore, the invention of a tenth aspect may have a configuration including logic filter/RS latch circuits each provided in a rear stage of the second level shift circuit to remove an erroneous signal output from the second level shift circuit because of variations in power source and GND potentials. Accordingly, an erroneous signal output from the level shift circuit because of variations in power source and GND potentials can be removed.

Yet furthermore, the invention of a eleventh aspect may be configured such that a plurality of combinations of the p-side and n-side driving circuits are integrated in one power semiconductor device. As such, the mounting-substrate area can be reduced, and the cost can thereby be reduced.

What is claimed is:

1. A power semiconductor device comprising:
   an input signal processor circuit to which control signals are input, and
   power device driving circuits for driving power devices based on output signal of the input signal processor circuit, and
   level shift circuits which are individually inserted between the input signal processor circuit and the power device driving circuit on a p-side and between the input signal processor circuit and the power device driving circuit on an n-side to electrically insulate ground lines for the p-side and n-side power device driving circuits and a ground line for the input signal processor circuit.

2. A power semiconductor device according to claim 1, further comprising a logic filter and RS latch circuits each provided in a rear stage of the level shift circuit to remove an erroneous signal output from the level shift circuit because of variations in power source and ground potentials.

3. A power semiconductor device according to claim 1, further comprising a current-pulse-train converter circuit connected to a rear stage of the input signal processor circuit to convert a voltage-amplified signal output from the input signal processor circuit into a current-pulse train.

4. A power semiconductor device according to claim 3, wherein said current-pulse-train converter circuit has pulse-applying functions to periodically input pulse signals to the level shift circuit while the level shift circuit is maintained in an ON or OFF state.

5. A power semiconductor device according to claim 1, further comprising protection circuits each detecting an abnormality of anyone of a shortcircuit, an overload, and an overvoltage in the p-side or n-side drive power device, wherein detection signals from the circuits are output to external control circuits via second level shift circuits.

6. A power semiconductor device according to claim 5, further comprising current-pulse-train converter circuits each provided in a front stage of the second level shift circuit to convert a voltage-amplified signal output from the protection circuit to a current-pulse train.

7. A power semiconductor device according to claim 5, further comprising a logic filter and RS latch circuits each provided in a rear stage of the second level shift circuit to remove an erroneous signal output from the second level shift circuit because of variations in power source and GND potentials.

8. A power semiconductor device according to claim 6, further comprising a logic filter and RS latch circuits each provided in a rear stage of the second level shift circuit to remove an erroneous signal output from the second level shift circuit because of variations in power source and GND potentials.

9. A power semiconductor device according to claim 1, wherein a plurality of combinations of the p-side and n-side driving circuits are integrated in one power semiconductor device.

* * * * *